United States Patent [19]
Fasano et al.

[11] Patent Number: 5,949,030
[45] Date of Patent: Sep. 7, 1999

[54] VIAS AND METHOD FOR MAKING THE SAME IN ORGANIC BOARD AND CHIP CARRIERS

[75] Inventors: Benjamin V. Fasano, New Windsor; Kevin M. Prettyman, Holmes, both of N.Y.

[73] Assignee: International Business Machines Corporation, Armonk, N.Y.

[21] Appl. No.: 08/971,064

[22] Filed: Nov. 14, 1997

[51] Int. Cl.[6] .................................. H05K 1/02; H05K 3/42
[52] U.S. Cl. .................... 174/262; 174/264; 174/265; 29/852; 205/125; 427/97
[58] Field of Search .................... 174/255, 261, 174/265, 266, 262, 264; 29/846, 852; 257/621, 698; 361/774, 777, 779, 719, 720, 748; 205/125; 427/97

[56] References Cited

U.S. PATENT DOCUMENTS

| | | | |
|---|---|---|---|
| 4,911,796 | 3/1990 | Reed | 205/125 |
| 5,300,911 | 4/1994 | Walters | 336/175 |
| 5,374,788 | 12/1994 | Endoh et al. | 174/266 |
| 5,421,083 | 6/1995 | Suppelsa et al. | 29/852 |
| 5,541,567 | 7/1996 | Fogel et al. | 336/200 |
| 5,653,834 | 8/1997 | Azzaro et al. | 427/97 |
| 5,689,091 | 11/1997 | Hamzehdoost et al. | 174/255 |

FOREIGN PATENT DOCUMENTS 2-94693  4/1990  Japan.

*Primary Examiner*—Hyung-Sub Sough
*Attorney, Agent, or Firm*—Ratner & Prestia; Tiffany L. Townsend

[57] ABSTRACT

Multiple vias are produced coaxially or in axis parallel alignment in a first or primary through-hole in a printed circuit board, chip carrier or like electrical device by producing a primary metallized through hole or via which is then filled or coated with a dielectric material which is also placed on both surfaces of the device at the ends of the via. The dielectric material inside the via can then be provided with at least one coaxial through-hole or multiple axis parallel through holes which can be metallized to form conductive paths between the surfaces of the device. Portions of the dielectric surface layer can be removed to expose contacts to the inner metallized via. Successive coaxial vias can be made in any number by the method of the invention. In addition electrical signal paths can be isolated within voltage or ground co-axial conductors.

8 Claims, 3 Drawing Sheets

VIAS AND METHOD FOR MAKING THE SAME IN ORGANIC BOARD AND CHIP CARRIERS

FIELD OF THE INVENTION

The present invention pertains to making coaxial conductor through-holes in a printed circuit board, chip carrier or like electrical device.

BACKGROUND OF THE INVENTION

During the production of electronic devices such as printed circuit boards and chip carriers it is often desirable to increase the through via density to increase the Input/Output (I/O) capacity of the devices. A conventional manufacturing process involves drilling or laser cutting a hole through the board or carrier followed by plating of the board or carrier to metallize the walls of the hole so as to provide a conductive path from the top to the bottom of the board or chip carrier.

There is a need to produce high density co-axial connections for what in the industry are called organic printed wiring boards (i.e. polymer with fiber and/or particulate filler).

U.S. Pat. No. 4,911,796 discloses and claims a method to make a via with metallized side walls by coating the side walls with an ink. A single conductor is formed through the circuit board cross-section.

U.S. Pat. No. 5,300,911 discloses and claims a structure with co-axial vias that are used to carry current from two or more coupled windings to form a monolithic transformer. Vias are first formed in a fired ceramic ferrite to produce through holes. Patentees do not disclose how the holes are formed. Thereafter, the surface of the ferrite as well as the through hole side walls are plated and metal features on the surfaces are defined. After that, a dielectric is coated over the metal and another layer of metal is plated on the surface and on the side walls. Additional conductor layers can be applied to form a third or fourth co-axial via structure if needed. Although patentees disclose a process for making co-axial vias in a magnetic device (ferrite ceramic) the vias thus produced are not discrete. Vias on a planar layer are connected, usually in series, to form a circuitous path into and out of the ferrite to act as a winding. The vias on a layer are also not individually accessible or used to provide a signal path for wiring above and below the plane of the wiring layer. The dielectric layer is applied globally to the substrate by a process that does not allow patterning or personalization. Thus, there is no method to interconnect sequential layers of metallization other than at the edges of the substrate.

U.S. Pat. No. 5,374,788 discloses and claims a structure having a single through-hole that is used for top to bottom connection in a printed circuit board. The core metal and via holes in the epoxy are coated with co-axial metal or solder layers to improve adhesion. The layers comprising the co-axial coating are not electrically isolated from each other.

U.S. Pat. No. 5,541,567 discloses forming a co-axial via by wire bonding wires to be used as center conductors to a conductive surface and then inserting the protruding wires through holes placed in a ceramic or magnetic material layer. This structure is designed to perform like a transformer or inductor. This process for making solid conductors for large area circuit boards by wire bonding is impractical. The alignment of thousands of pins through an array of thousands of holes is also not achievable by conventional manufacturing processes. The finest pitch that could be attained would be much greater than a photolithographically or laser defined via pitch according to the present invention.

U.S. Pat. No. 5,653,834 discloses and claims a process to make electrical feed throughs for ceramic circuit board support substrates by coating the side walls of holes in an oxidized metal sheet with a glass. Thereafter the holes are metallized to provide a single conductor through the circuit board cross-section.

According to industry practice a single through via in a circuit board is produced by drilling or laser cutting holes through a carrier board. Multiple dielectric layers, platings and fillings are used to build up layers on both sides of the circuit board.

SUMMARY OF THE INVENTION

According to the present invention multiple vias having generally parallel axes or aligned co-axially are produced in a printed circuit board, chip carrier or like electronic device by: providing a primary through-hole in the device, the through-hole extending from a top to a bottom surface of the device, thereafter metallizing the through-hole to provide a conductive path from the top surface to the bottom surface of the device, thereafter filling the metallized through-hole with a dielectric and covering the top and bottom surfaces with a dielectric, possibly a photo sensitive polymer, thereafter forming, possibly by drilling, at least one secondary-hole through the dielectric in said through-hole and the top and bottom surface dielectric layers, the secondary through-hole being spaced apart from and not in contact with the plating on the primary through-hole, then metallizing the secondary through-hole to provide a conductive path between the first and second surfaces covered with the surface dielectric layers, then filling the secondary through-hole(s) with a dielectric and covering the first and second surfaces with a second dielectric layer and thereafter removing a portion of the first and/or second layer of the surface dielectric layer covering the top and/or bottom of the device to permit making independent electrical contact with the first and second metallized surfaces of the first and second through-holes. The secondary through-holes can be a plurality of axially aligned holes inside of the first through-hole or can be a single co-axially aligned hole in the first through-hole. Subsequent through-holes electrically insulated one from the other can be made in the initial or primary hole by the same process. The number of co-axially aligned through-holes is limited by the size of the initial through-hole and the ability to precisely drill and metallize subsequently smaller holes in the intervening dielectric layers without making electrical contact with the previously metallized through-hole.

Ideally a device would be produced with three co-axially aligned through-holes to produce a ground/signal/voltage combination to be produced within each through-hole via set. Such a structure would provide exceptional signal isolation for high wiring density and high frequency applications.

Thus in one aspect, the invention is a method of making multiple vias having generally parallel axes in a printed circuit board or chip carrier by providing a primary through-hole in the circuit board or chip carrier, the through-hole extending from a top to a bottom surface of the circuit board or chip carrier, metallizing the primary through-hole to provide a conductive path from the top surface to said bottom surface of the circuit board or chip carrier, filling or coating the metallized through-hole with a dielectric material and covering the top and bottom surfaces with a dielectric layer forming at least one secondary through-hole through the dielectric in the primary through hole and dielectric layers, the secondary through-hole being spaced apart from and not in contact with the metallization on the primary through-hole, metallizing the secondary through-hole to provide a conductive path between the first and second surfaces covered with the dielectric layers, filling or coating the secondary through-hole with a dielectric material and covering the first and second surfaces with a second dielectric layer, and thereafter removing a portion of the first and/or second layer of the dielectric covering the top or bottom of the circuit board or chip carrier to permit making (independent) electrical contact with the first and/or second metallized surfaces on the first and second through-holes.

The invention is also a multiple via structure having generally parallel axes in a printed circuit board or chip carrier manufactured by providing a primary through-hole in the circuit board or chip carrier, the through-hole extending from a top to a bottom surface of the circuit board or chip carrier, metallizing the primary through-hole to provide a conductive path from the top surface to the bottom surface of the circuit board or chip carrier filling or coating the metallized through-hole with a dielectric material and covering the top and bottom surfaces with a dielectric layer, forming at least one secondary through-hole through the dielectric in the primary through-hole and dielectric layers, the secondary through-hole being spaced apart from and not in contact with the metallization on the primary through-hole, metallizing the secondary through-hole to provide a conductive path between the first and second surfaces covered with the dielectric layers filling or coating the secondary through-hole with a dielectric material and covering the first and second surfaces with a second dielectric layer, and removing a portion of the first and/or second layer of the dielectric covering the top or bottom of the circuit board or chip carrier to permit making (independent) electrical contact with the first and second metallized surfaces on the first and second through-holes.

DETAILED DESCRIPTION OF THE INVENTION

Figure 1A:
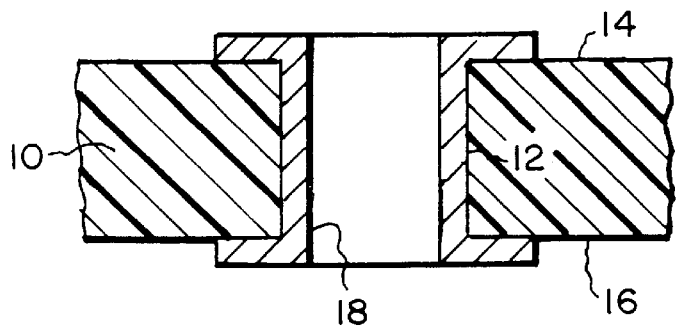
FIGS. 1A through 1F schematically illustrate the process of the present invention.

Referring to FIG. 1A numeral 10 indicates a suitable substrate for the method of the present invention. The substrate 10 can be an organic printed circuit board or a ceramic substrate or like electronic device. The organic printed circuit boards are generally a polymer with a fiber/particulate filler.

As shown in FIG. 1A a through-hole 12 is produced in the printed circuit board or electronic device by conventional technology as is well known in the art. Through-hole 12 extends from a first or top surface 14 to a second or bottom surface 16 of the device 10. The through-hole is metallized (e.g. by a plating technique) with a conductive coating 18 to provide a conductive path from the top surface 14 to the bottom surface 16 of the device 10. The metallization extends onto the top 14 and bottom 16 surfaces as shown in FIG. 1A resulting in a via surface feature such as a ring or donut as is well known in the art.

Figure 1B:
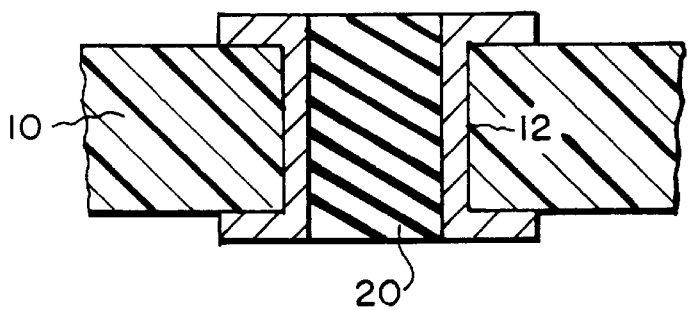

As shown in FIG. 1B the first plated through-hole 12 is filled with a dielectric material 20 as is well known in the art. This dielectric can, for example, be a ceramic paste or ink, or a polymer material. Although FIG. 1B shows complete filling of the via, it is also possible to only coat the side walls so as to provide the necessary dielectric layer thickness.

Figure 1C:
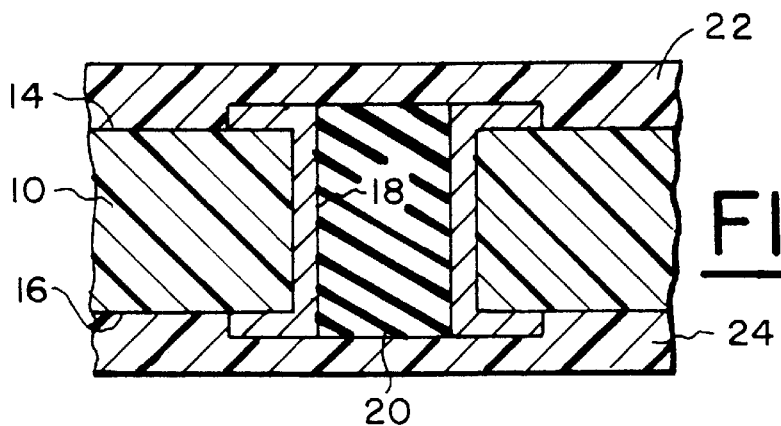

Thereafter as shown in FIG. 1C the top and bottom surfaces (14, 16 respectively) of device 10 are covered with dielectric layers 22, 24 respectively. These can, for example, be formed from a photosensitive polymer deposited as a film or solution. Likewise a ceramic paste ink or unfired green tape can be used.

Figure 1D:
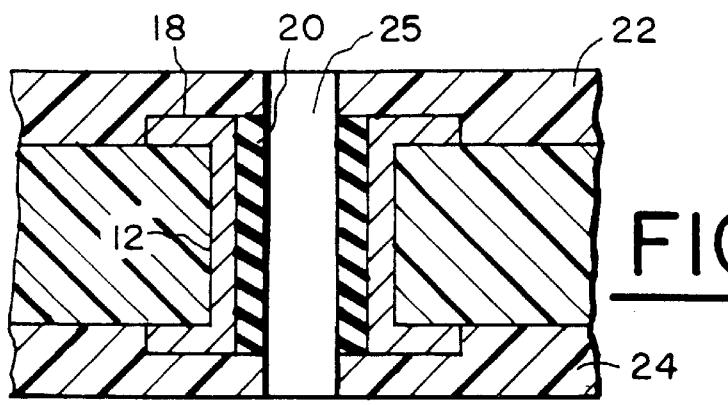

Then as shown in FIG. 1D a second through-hole 25 is drilled through the dielectric layers 22, 24 and the dielectric material 20 inside of the first through-hole 12. While the secondary through-hole 25 is shown as co-axially aligned with the primary through-hole 12 it is also possible to have a plurality of secondary through-holes disposed inside of the primary through-hole and dielectric material with the holes arranged in an axis parallel configuration disposed symmetrically or asymmetrically around the longitudinal axis of the primary through-hole.

Figure 1E:
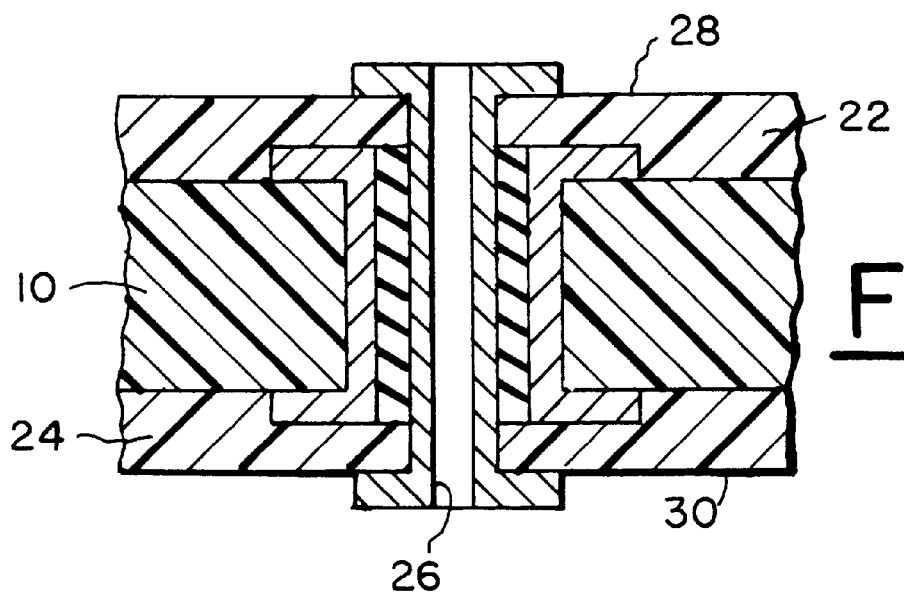

As shown in FIG. 1E the secondary through-hole 25 is provided with a conductive or metallized coating 26 which extends between the top 28 and bottom 30 of layers 22, 24 respectively. The metallization extends onto the top 28 and bottom 30 surfaces resulting in a via surface feature such as a ring or donut as is well known in the art.

Figure 1F:
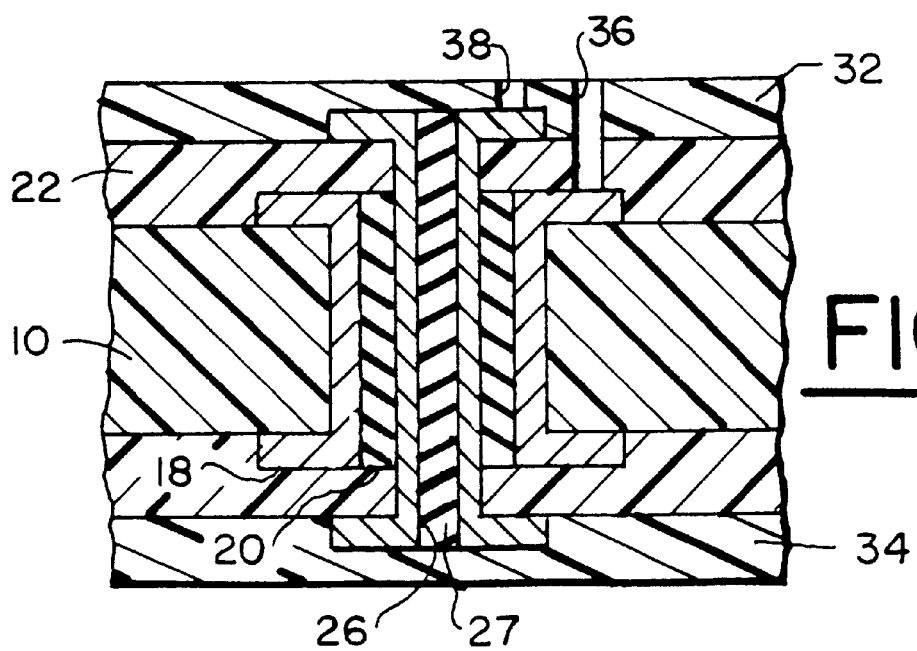

FIG. 1F shows the coated secondary through-hole 25 filled with a dielectric 27 and top 32 and bottom 34 dielectric cover layers placed over layers 22, 24 of the device. Thereafter, passage 36 can be formed by lithography or laser ablation through the cover layer 32 and layer 22 to permit electrical contact with the metallized surface features of the first conductive feed through 18 in via 12. A second passage or hole 38 can be produced in the cover 32 to permit electrical contact to the metallized portion 26 of the second through-hole 25. Passages 38 and 36 can be metallized by processes well known in the art to produce electrical connection to the axial through vias.

Exposure of the metallic portions 18 and 26 of the first and second holes can be accomplished on the bottom of the device 10 in a manner similar to that used for exposing the metallic portions on the top surface.

Figure 2:
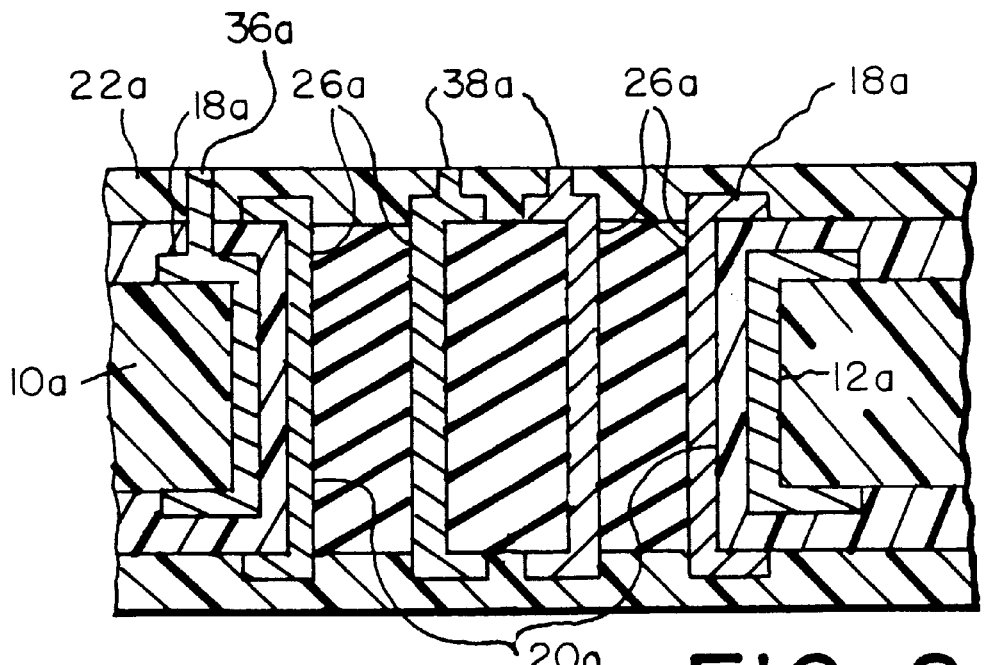
FIG. 2 is a schematic representation of a device with plurality of secondary through-holes produced according to the process of the present invention.

Referring now to FIG. 2 a multiple via structure with axis parallel vias is shown. In FIG. 2 the portions of the structure identical to those of FIGS. 1A–1F are identified with identical numbers with a suffix "a". In FIG. 2 two vias 20a are shown in axis parallel relationship inside of via 12a. The surfaces of via 20a are provided with metallized coating 26a and electrical contacts 38a.

Figure 3:
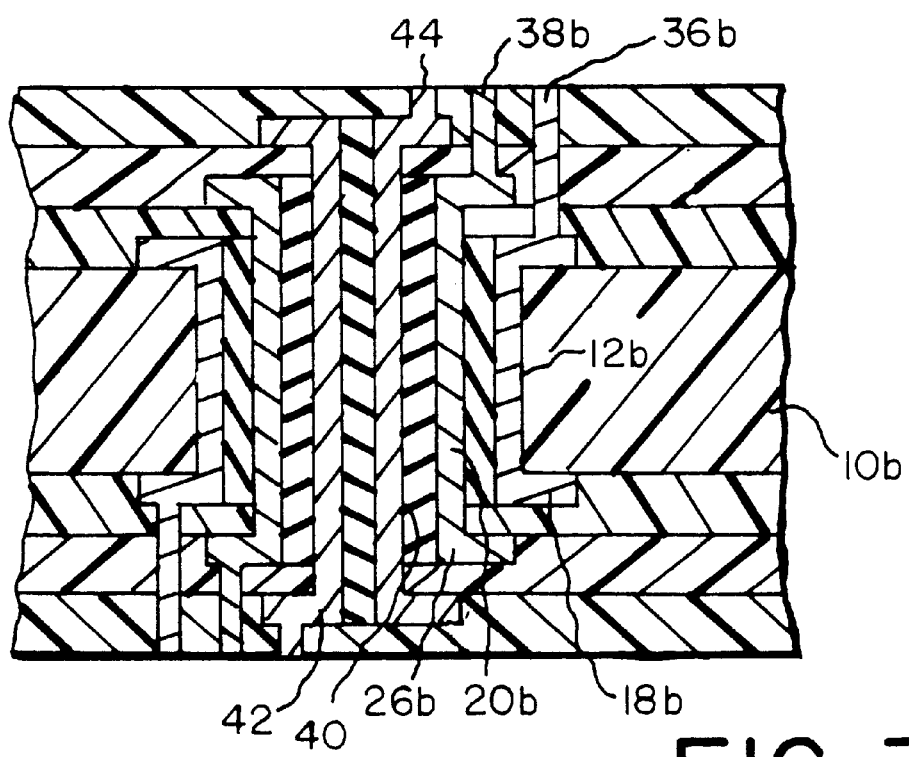
FIG. 3 is a schematic representation of a device with co-axial through-holes produced according to the process of the present invention.

As shown in FIG. 3 a structure with three coaxial vias can be produced in the board or carrier. In FIG. 3 like numbers with the suffix "b" are used to identify like parts of FIGS. 1A through 1F. In FIG. 3 primary via 12b is sized so that secondary via 20b and tertiary via 40 will, with intervening layers of dielectric material, fit inside via 12b. Each of the primary 12b, secondary 20b and tertiary 40 vias have metallized surfaces 18b, 26b and 42 respectively, which in turn can be connected to surface wiring by vias 36b, 38b and 44.

In the case of the devices of FIGS. 2 and 3 electrical contact with the bottom of each via surface of the device can be made in the same manner as described in regard to FIG. 1F above.

It is within the scope of the present invention to make or use edge or internal connections to the metallized of one or more of vias.

The method of the present invention permits making connections through insulating layers used within an electronic package which significantly increases the Input/Output (I/O) density through the layers. The method and the resulting structure significantly improve electrical isolation of signals passed through the insulating layer.

The top and bottom layers of the resulting electrical feed through device can have surface features resembling donuts or stacked rings with a dielectric layer between their planar surfaces. These are the terminal surfaces of the conductive metal vias which are formed through the dielectric layers. Connections can also be made directly to these terminal metal surfaces for X, Y wiring. Although FIGS. 1–3 show vias (36, 36a, 36b and 38, 38a, 38b) connected to each metallized via, some vias could be used to provide X, Y wiring and not have direct connection to the external surfaces of carrier 10.

Table 1 shows the I/O density/square mil of surface obtained on the same pitch with single via versus two co-axial vias with the same major axis. One mil is 0.001 inches.

TABLE 1

| Via Diameter (mils) | Via Pitch (mils) | *Possible Coaxial Via Diam (min 1 mil sidewall) (mils) | Cage Size (square mils) | Single Via Density (I/O per square mil) | Coaxial Via Density (I/O per square mil) |
|---|---|---|---|---|---|
| 8 | 12 | 4 | 400 | 0.010 | 0.020 |
| 6 | 12 | 4 | 324 | 0.012 | 0.025 |
| 8 | 10 | 4 | 324 | 0.012 | 0.025 |
| 6 | 10 | 4 | 256 | 0.016 | 0.031 |
| 5 | 10 | 3 | 225 | 0.018 | 0.036 |
| 4 | 10 | 2 | 196 | 0.020 | 0.041 |
| 6 | 8 | 4 | 196 | 0.020 | 0.041 |
| 5 | 8 | 3 | 169 | 0.024 | 0.047 |
| 3 | 10 | 1 | 169 | 0.024 | 0.047 |
| 2 | 10 | 0.5 | 144 | 0.028 | 0.056 |
| 4 | 8 | 2 | 144 | 0.028 | 0.056 |
| 3 | 8 | 1 | 121 | 0.033 | 0.066 |
| 4 | 6 | 2 | 100 | 0.040 | 0.080 |
| 2 | 8 | 0.5 | 100 | 0.040 | 0.080 |
| 3 | 6 | 1 | 81 | 0.049 | 0.099 |
| 2 | 6 | 0.5 | 64 | 0.063 | 0.125 |
| 2 | 4 | 0.5 | 36 | 0.111 | 0.222 |

*Assumes after inner coaxial formation there is 1 mil of sidewall left as a dielectric (i.e. no allowance for outer metallization thickness).

From Table 1 it should be noted, that, for instance, a single 4 mil diameter via on a 6 mil pitch has an I/O density of about 0.04 I/O/sq.mil. The same I/O density can be obtained with two co-axial vias placed one within the other that are 4 and 6 mils in diameter (the 4 mil via being placed through the previously drilled 6 mil hole) when placed on a more readily manufactured 8 mil pitch. On a fixed pitch the I/O density can be at least doubled by using two coaxial vias as shown in Table 1.

Grouping of vias co-axially, according to the present invention, also provides more area between vias for routing of lines between the vias. This is a significant advantage from using the present invention to produce co-axial vias.

The present invention overcomes another problem encountered in the production of large high density organic circuit boards. Typically, in these boards a metal core is used as a stiffener and a thermal coefficient of expansion (TCE) reducer. In order to produce through vias from the top to bottom surfaces many small holes, often as small as 2 mils in diameter need to be produced. This is difficult and expensive since drilling equipment must be replaced with laser tooling. The present invention allows for fewer holes and holes of a larger diameter to be made in the board through the stiffener to achieve the same I/O density. Subsequent co-axial via connections are made in the dielectric filler within the larger hole. This alleviates manufacturing concerns and reduces costs.

To improve signal isolation, the signal vias are usually surrounded by ground or voltage vias to form an electrical "cage." The shielding vias are usually in excess of what is actually needed for power and ground requirements, consume space, and increase the manufacturing difficulty at increased cost. Using a single large co-axial via structure according to the present invention, which has a signal via surrounded by an outer ground or signal via, provides much better isolation using much less area on the board than a typical cage of ground or voltage vias surrounding a signal via. Also, by using three vias within a single co-axial via structure a highly desirable tri-via structure comprising a signal via 42 surrounded by alternating Voltage (18b or 26b) or Ground (18b or 26b) vias can be produced. This is shown in FIG. 3.

Although illustrated and described herein with reference to certain specific embodiments, the present invention is nevertheless not intended to be limited to the details shown. Further, various modifications may be made in the details within the scope of the invention as defined in the following claims.

What is claimed:

1. A method of making multiple vias having generally parallel axes in a printed circuit board or chip carrier comprising the steps of:

(a) providing a primary through-hole in said circuit board or chip carrier, said through-hole extending from a top to a bottom surface of said circuit board or chip carrier;

(b) metallizing said primary through-hole to provide a conductive path from said top surface to said bottom surface of said circuit board or chip carrier;

(c) filling or coating said metallized through-hole with a dielectric material and covering said top and bottom surfaces with a first dielectric layer;

(d) forming at least two secondary through-holes having longitudinal axes parallel to each other and parallel to a longitudinal axis of said primary through-hole through said dielectric in said primary through-hole and through said first dielectric layer on said top and bottom surfaces, said secondary through-holes being spaced apart from and not in contact with said metallization on said primary through-hole;

(e) metallizing said secondary through-holes to provide conductive paths between said top and bottom surfaces covered with said first dielectric layer;

(f) filling or coating said metallized secondary through-holes with a dielectric material and applying a second dielectric layer to cover said top and bottom surfaces covered with said first dielectric layer and said secondary through holes; and (g) removing portions of one of said top and bottom layers of said dielectric covering one of said top and bottom surface of said circuit board or chip carrier to permit making independent electrical contacts with said primary and said secondary metallized through-holes, respectively.

2. A method according to claim 1 including removing portions of said top and bottom layer of said dielectric covering both top and bottom surfaces of said circuit board or chip carrier to permit making independent electrical contacts with both ends of each of said primary and secondary metallized through-holes.

3. A method according to claim 1 wherein each dielectric layer is formed from a predominantly polymeric material.

4. A method according to claim 1 wherein each dielectric layer is formed from a predominantly ceramic material.

5. A multiple via structure having generally parallel axes in a printed circuit board or chip carrier manufactured by:

(a) providing a primary through-hole in said circuit board or chip carrier, said through-hole extending from a top to a bottom surface of said circuit board or chip carrier;

(b) metallizing said primary through-hole to provide a conductive path from said top surface to said bottom surface of said circuit board or chip carrier;

(c) filling or coating said metallized through-hole with a dielectric material and covering said top and bottom surfaces with a first dielectric layer;

(d) forming at least two secondary through-holes having longitudinal axes parallel to each other and parallel to a longitudinal axis of said primary through-hole through said dielectric in said primary through-hole and through said first dielectric layer on said top and bottom surfaces, said secondary through-holes being spaced apart from and not in contact with said metallization on said primary through-hole;

(e) metallizing said secondary through-holes to provide conductive paths between said top and bottom surfaces covered with said first dielectric layer;

(f) filling or coating said metallized secondary through-holes with a dielectric material and applying a second dielectric layer to cover said top and bottom surfaces covered with said first dielectric layer and said secondary through holes; and (g) removing portions of one of said top and bottom layers of said dielectric covering one of said top and bottom surface of said circuit board or chip carrier to permit making independent electrical contacts with said primary and said secondary metallized through-holes, respectively.

6. A structure according to claim 5 including removing portions of said top and bottom layer of said dielectric covering both top and bottom surfaces of said circuit board or chip carrier to permit making independent electrical contacts with both ends of each of said primary and secondary metallized through-holes.

7. A structure according to claim 5 wherein all dielectric layers are of a predominantly polymeric material.

8. A structure according to claim 5 wherein all dielectric layers are of a predominantly ceramic material.

* * * * *